United States Patent [19]

Kapoor

[11] Patent Number: 5,670,393
[45] Date of Patent: Sep. 23, 1997

[54] METHOD OF MAKING COMBINED METAL OXIDE SEMICONDUCTOR AND JUNCTION FIELD EFFECT TRANSISTOR DEVICE

[75] Inventor: Ashok K. Kapoor, Palo Alto, Calif.

[73] Assignee: LSI Logic Corporation, Milpitas, Calif.

[21] Appl. No.: 501,289

[22] Filed: Jul. 12, 1995

[51] Int. Cl.⁶ .................................................. H01L 21/265
[52] U.S. Cl. ................................. 437/29; 437/34; 437/41; 437/56; 437/160; 437/911; 148/DIG. 35; 148/DIG. 88
[58] Field of Search ............................... 437/34, 56, 57, 437/58, 59, 40, 41, 160, 911; 148/DIG. 35, DIG. 88

[56] References Cited

U.S. PATENT DOCUMENTS

| | | | |
|---|---|---|---|
| 3,879,619 | 4/1975 | Pleshko | 307/251 |
| 4,373,253 | 2/1983 | Khadder et al. | 29/576 B |
| 4,395,812 | 8/1983 | Bergeron et al. | 437/59 |
| 4,403,395 | 9/1983 | Curran | 437/59 |
| 4,523,111 | 6/1985 | Baliga | 307/574 |
| 4,527,325 | 7/1985 | Geipel et al. | 29/571 |
| 4,551,909 | 11/1985 | Cogan et al. | 437/40 |
| 4,558,508 | 12/1985 | Kinney | 29/571 |
| 4,568,842 | 2/1986 | Koike | 307/279 |
| 4,596,068 | 6/1986 | Peters, Jr. | 437/41 |
| 4,602,419 | 7/1986 | Harrison et al. | 437/59 |
| 4,654,548 | 3/1987 | Tanizawa et al. | 307/450 |
| 4,700,461 | 10/1987 | Choi et al. | 437/41 |
| 4,786,958 | 11/1988 | Bhagat | 357/38 |
| 4,816,705 | 3/1989 | Ohba et al. | 307/446 |
| 4,912,053 | 3/1990 | Schrantz | 437/41 |
| 4,947,064 | 8/1990 | Kim et al. | 307/594 |
| 5,015,596 | 5/1991 | Toyoda et al. | 437/41 |
| 5,120,669 | 6/1992 | Schrantz | 437/41 |
| 5,132,241 | 7/1992 | Su | 437/70 |
| 5,160,855 | 11/1992 | Dobberpahl | 307/270 |
| 5,216,294 | 6/1993 | Ryu | 307/443 |
| 5,223,449 | 6/1993 | Morris et al. | 437/59 |
| 5,252,501 | 10/1993 | Moslehi | 437/34 |
| 5,254,864 | 10/1993 | Ogawa | 437/40 |
| 5,266,849 | 11/1993 | Kitahara et al. | 307/475 |
| 5,296,409 | 3/1994 | Merrill et al. | 437/34 |
| 5,313,082 | 5/1994 | Eklund | 257/262 |
| 5,324,683 | 6/1994 | Fitch et al. | 437/65 |
| 5,428,234 | 6/1995 | Sumi | 257/287 |
| 5,496,751 | 3/1996 | Wei et al. | 437/41 |

FOREIGN PATENT DOCUMENTS

| | | | |
|---|---|---|---|
| 0012777 | 2/1981 | Japan | 437/40 |
| 62-179113 | 8/1987 | Japan | H01L 21/205 |
| 0028926 | 1/1989 | Japan | 437/40 |

OTHER PUBLICATIONS

*VLSI Fabrication Principles, Silicon and Gallium Arsenide*, Sorab K. Ghandhi, Rensselaer Polytechnic Institute, John Wiley & Sons, 1983, pp. 392–394.

*Primary Examiner*—John Niebling
*Assistant Examiner*—Long Pham
*Attorney, Agent, or Firm*—Fenwick & West LLP

[57] ABSTRACT

An electrical circuit and method combine junction field effect transistors (JFET) and metal oxide semiconductor (MOS) circuits in series between $V_{DD}$ and ground, with a feedback of output voltage to control current from $V_{DD}$ to ground. The electrical circuit comprises a complementary metal oxide semiconductor (CMOS) inverter circuit with an input and an output, and a JFET having a gate coupled to the CMOS inverter for feedback to control the JFET. The JFET and CMOS circuitry is formed on a common substrate with the JFET gate junction being formed by implanting impurity dopants through a layer of gate oxide.

3 Claims, 5 Drawing Sheets

METHOD OF MAKING COMBINED METAL OXIDE SEMICONDUCTOR AND JUNCTION FIELD EFFECT TRANSISTOR DEVICE

TECHNICAL FIELD

This invention relates to semiconductor circuits and more particularly to combined junction field effect transistor (JFET) and metal oxide semiconductor (MOS) transistor circuits and methods of fabricating such circuits.

BACKGROUND

Currently, semiconductor devices can be fabricated on a selected semiconductor substrate using either metal oxide semiconductor (MOS) transistors or junction field effect transistors (JFET). MOS transistors have a layer of insulating material between the gate and the substrate. Thus, channel current in MOS transistors is controlled by the application of electric fields across the channel to enhance and deplete the channel region as operation requires. JFETs, on the other hand, have a PN junction at the control gate which can be reverse biased by the application of a selected gate voltage. This gate PN junction is accordingly used to control the channel current by varying the extent of a depletion region which in turn narrows or widens the current-carrying channel.

MOS transistor circuits are characterized by parameters such as the sub-threshold leakage current, the power-delay product, and the saturation current. Sub-threshold leakage current is the current which flows from the transistor source to the transistor drain when the gate voltage is less than the threshold voltage ($V_t$). It is a circuit current proportional to the voltage drop from the source to the drain. The power-delay product is a measure of the power dissipation times the propagation delay through a device. The saturation current, or as it is sometimes called, the "drain current" is the electric current Which flows from the source to the drain during transistor operation and is proportional to the difference between actual source voltage and $V_t$. It is typically desirable to reduce both the sub-threshold leakage current and the power-delay product while at the same time maintaining a sufficiently large drain current. Thus, there is a need for a semiconductor device which reduces both the sub-threshold leakage current and the power-delay product while maintaining a sufficient drain current.

SUMMARY OF THE INVENTION

In accordance with the present invention, a combined junction field effect transistor (JFET) and a metal oxide semiconductor (MOS) circuit has a decreased sub-threshold leakage current and a decreased power-delay product. According to one embodiment of the present invention, a JFET is serially coupled to a CMOS inverter circuit between $V_{DD}$ and ground to provide a feedback path to and from the inverter circuit by coupling the JFET gate to the output of the CMOS inverter circuit. This causes the JFET to turn on and off with inverter state changes. Accordingly, the JFET operates as an active control device to reduce the voltage at the source of the MOS transistor and to selectively isolate the CMOS inverter from the source voltage.

In one embodiment, an n-channel JFET is connected serially to a pull-up p-channel MOS (PMOS) transistor. In another embodiment, a p-channel JFET is connected serially to a pull-down n-channel MOS (NMOS) transistor.

In accordance with the present invention, the JFET and MOS transistors may be fabricated on a common substrate using a standard MOS process by implanting a charged material directly through the insulating layer of gate oxide to form the gate PN junction of the JFET.

DETAILED DESCRIPTION OF THE INVENTION

Figure 1:
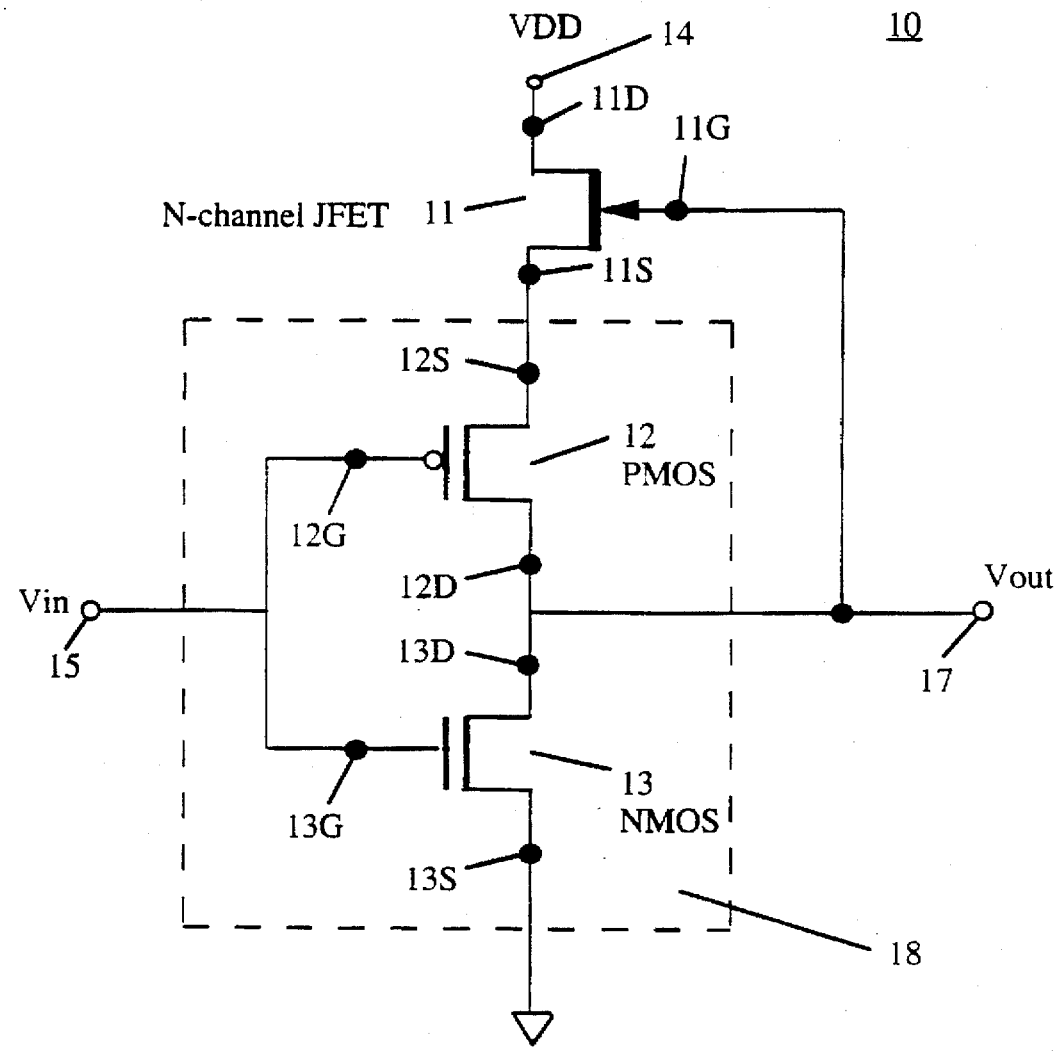
FIG. 1 is a schematic diagram of an electrical circuit in accordance with the present invention.

FIG. 1 shows a semiconductor circuit 10 in accordance with the present invention, including a CMOS inverter 18 and an n-channel JFET 11. JFET 11 has source, gate and drain electrodes 11S, 11G and 11D respectively. Inverter 18 comprises a p-channel MOS, i.e., PMOS, transistor 12 having source, gate and drain electrodes 12S, 12G and 12D respectively and an n-channel MOS, i.e., NMOS transistor 13 having source, gate and drain electrodes 13S, 13G and 13D respectively. In this embodiment of the present invention, the gates of PMOS and NMOS transistors 12G, 13G are electrically coupled at input node Vin 15 and their drains 12D and 13D are electrically coupled to form output node Vout 17. Input node Vin is an electrical node, lead, contact or other means for receiving an input electrical signal. Output node Vout is an electrical node, lead, contact or other means for providing an output electrical signal. When PMOS transistor source 12S is coupled to a positive voltage source, PMOS transistor 12 acts as a pull-up transistor. When NMOS transistor source 13S is coupled to a negative voltage source, or to ground, NMOS transistor 13 acts as a pull-down transistor. In the preferred embodiment NMOS transistor source 13S is coupled to ground 16. If 12S were connected directly to $V_{DD}$ and JFET 11 were removed, the remaining circuit would be a CMOS inverter.

During switching, in order to reduce the sub-threshold leakage current flowing from the PMOS drain to source and to obtain a decreased power-delay product in accordance with the present invention, JFET transistor 11 is connected in series with PMOS transistor 12, and the output of CMOS inverter 18 is connected to the gate of JFET transistor 11. JFET source 11S is electrically coupled to PMOS source 12S, and JFET drain 11D is electrically coupled to voltage node $V_{DD}$ 14. This configuration of the present invention enhances switching speeds and reduces the current that leaks from the power supply $V_{DD}$ to ground during switching operation. In particular, leakage current is reduced by electrically isolating transistor source 12S from voltage potential $V_{DD}$ 14 by means of JFET 11. When JFET 11 is off, only leakage current flows from the drain 11D to the source 11S. Thus, when JFET 11 is off, source 12S is isolated from voltage potential $V_{DD}$ 14 which yields a reduced leakage current.

The configuration of the JFET 11 shown in FIG. 1 further reduces the power-delay product of CMOS inverter 18 by reducing the voltage at source 12S when PMOS transistor 22 is turning off. When the JFET 11 is on, PMOS transistor source 12S is connected to $V_{DD}$. Therefore, the voltage at transistor source 12S equals $V_{DD}$. However, when JFET 11 is turned off, then the voltage at 12S, the PMOS transistor source becomes reduced, because when JFET 11 starts turning off, there is a resistance level between 11D and 11S which causes a voltage separation between 11D and 11S, with the voltage at 11S being below VDD. To turn off PMOS transistor 12, the input voltage at gate 12G goes from low to high, with PMOS transistor 12 turning off when the voltage difference between 12G and 12S goes within the PMOS transistor 12 threshold voltage. According to the present invention, the threshold voltage of PMOS transistor 12 is reached at an accelerated rate, because the voltage at 12S is dropping as the voltage at 12G is rising. This enhances the switching speed of PMOS transistor 12, by reducing the voltage change that it must effect in order to switch states. Additionally, the threshold voltage $V_t$ of the PMOS transistor 12 is reduced, thereby increasing the drain current of transistor 12 and improving its drive characteristics.

Figure 2:
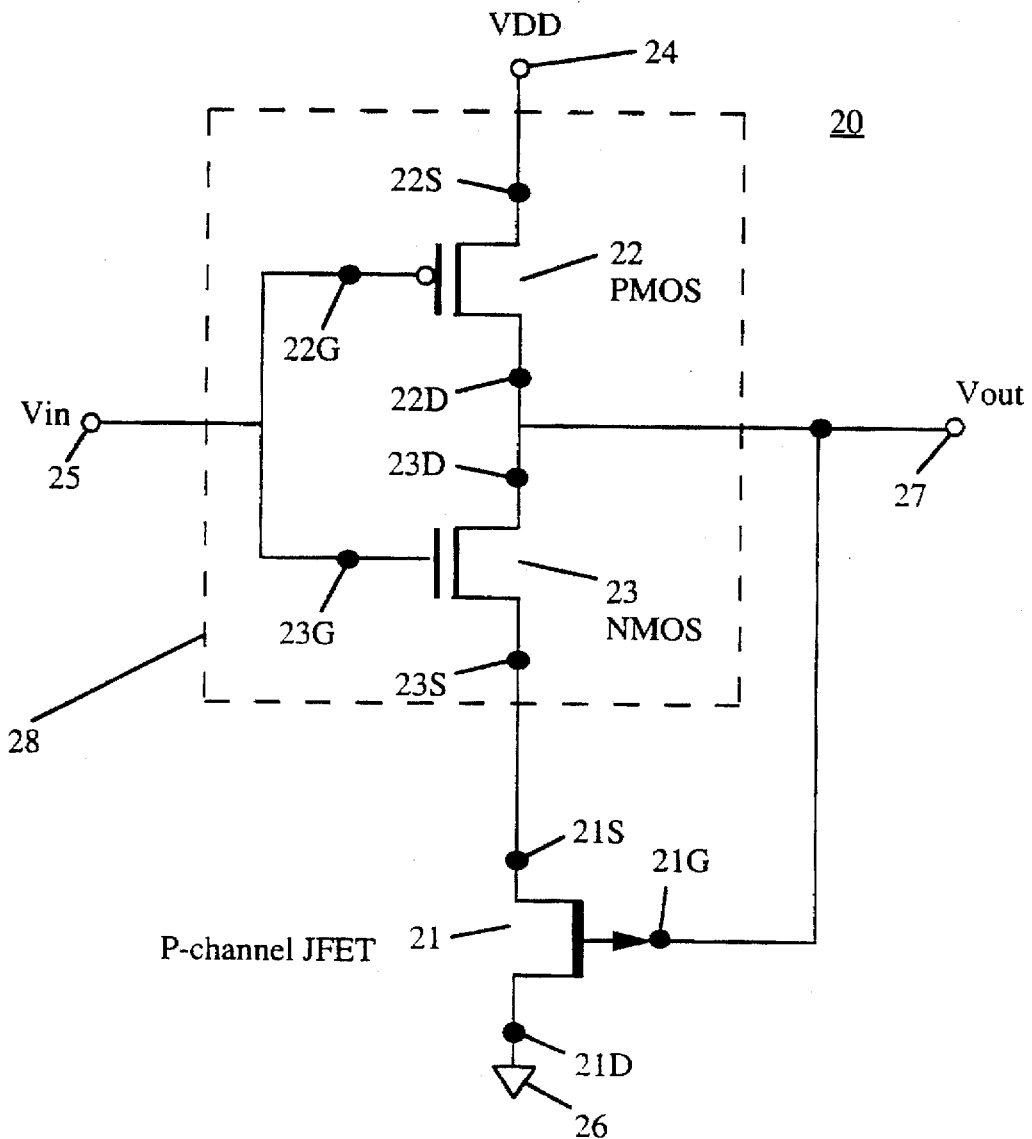
FIG. 2 is a schematic diagram of an electrical circuit in accordance with the present invention.

FIG. 2 shows a semiconductor inverter circuit 20 in accordance with another embodiment of the present invention. Inverter circuit 20 comprises a conventional CMOS inverter 28 and a p-channel JFET 21 having source, gate and drain electrodes 21S, 21G and 21D respectively. The conventional CMOS inverter 28 comprises a PMOS transistor 22 having source, gate and drain electrodes 22S, 22G and 22D respectively and an NMOS transistor 23 having source, gate and drain electrodes 23S, 23G and 23D respectively. In this embodiment, gates 22G, 23G of the PMOS and NMOS transistors 22, 23 are electrically coupled to form input voltage node Vin 25. Drains 22D and 23D are electrically coupled to form output node Vout 27. The PMOS transistor source 22S forms the pull up voltage node of CMOS inverter 28 and is electrically coupled to voltage potential $V_{DD}$ 24. NMOS transistor source 23S forms the pull down voltage node of CMOS inverter 28 and is electrically coupled to JFET gate source 21S. JFET gate 21G is electrically coupled to output node Vout 27. JFET drain 21D is electrically coupled to voltage potential 26. In the preferred embodiment, voltage potential 26 is ground. Accordingly, CMOS inverter 28 and JFET 21 are connected in series between $V_{DD}$ and ground, with Vout from CMOS inverter 28 connected to JFET gate 21G.

The configuration of the JFET 21 shown in FIG. 2 further reduces the power-delay product of CMOS inverter 28 by increasing the voltage at source 23S when NMOS transistor 23 is turning off, thereby reducing the current that leaks from $V_{DD}$ to ground. When JFET 21 is on, NMOS transistor source 12S is connected to ground. Therefore, the voltage at transistor source 23S equals zero. However, when JFET 21 is turned off, the voltage at 23S, the NMOS transistor source, increases, because when JFET 21 starts turning off, there is a resistance level between 21D and 21S which causes a voltage drop between 21D and 21S, with the voltage at 21S being above zero. To turn off NMOS transistor 23, the input voltage at gate 23G goes from high to low, with NMOS transistor 23 turning off when the voltage difference between 23G and 23S goes within the NMOS transistor 23 threshold voltage. According to the present invention, the threshold voltage of NMOS transistor 23 is reached at an accelerated rate, because the voltage at 23S is rising as the voltage at 23G is decreasing. This enhances the switching speed of NMOS transistor 23, by reducing the voltage change that it must effect in order to switch states. Additionally, the threshold voltage $V_t$ of the NMOS transistor 23 is reduced, thereby increasing the drain current of transistor 23 and improving its drive characteristics.

Figure 3:
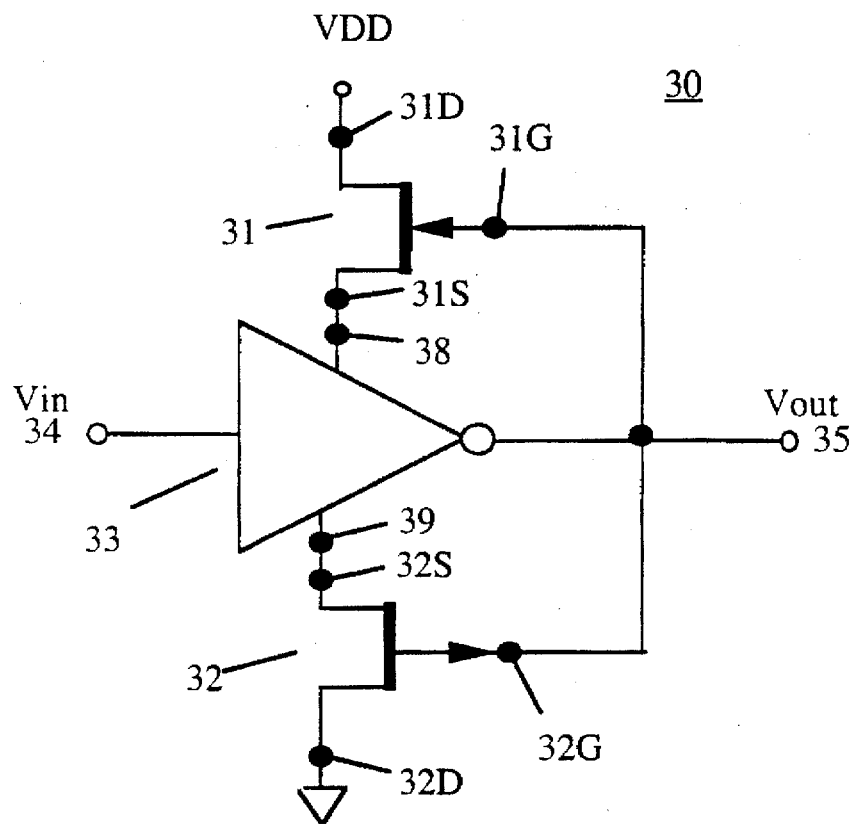
FIG. 3 is a schematic diagram of an electrical circuit in accordance with the present invention.

FIG. 3 illustrates inverter circuit 30 in accordance with another embodiment of the present invention. Inverter circuit 30 includes first and second JFET transistors 31, 32 and CMOS inverter 33, with transistors 31 and 32 each being gate controlled by Vout from inverter 33. Each JFET 31, 32 has a source, gate and drain electrode 31S, 32S, 31G, 32G and 31D, 32D respectively. CMOS inverter 33, with transistors 31 and 32 each being gate controlled by Vout from inverter 33 has an input node Vin 34, an output node Vout 35, a pull-up voltage node 38 and a pull-down voltage node 39. JFET source 32S is coupled to the inverter pull-down node 39 and the drain 32D is coupled to ground. JFET source 31S is coupled to inverter pull-up node 38, and JFET drain 31D is coupled to power source $V_{DD}$. JFETs 31,32 are thus configured according to the present invention to connect the inverter output Vout 35 to their respective gates, and to operate as active control devices to decrease both the sub-threshold leakage current and decrease the power-delay product of the overall circuit. When inverter 33 goes low JFET 31 speeds up the transition by turning off. When inverter 33 goes high JFET 32 speeds up the transition by turning off.

Figure 4:
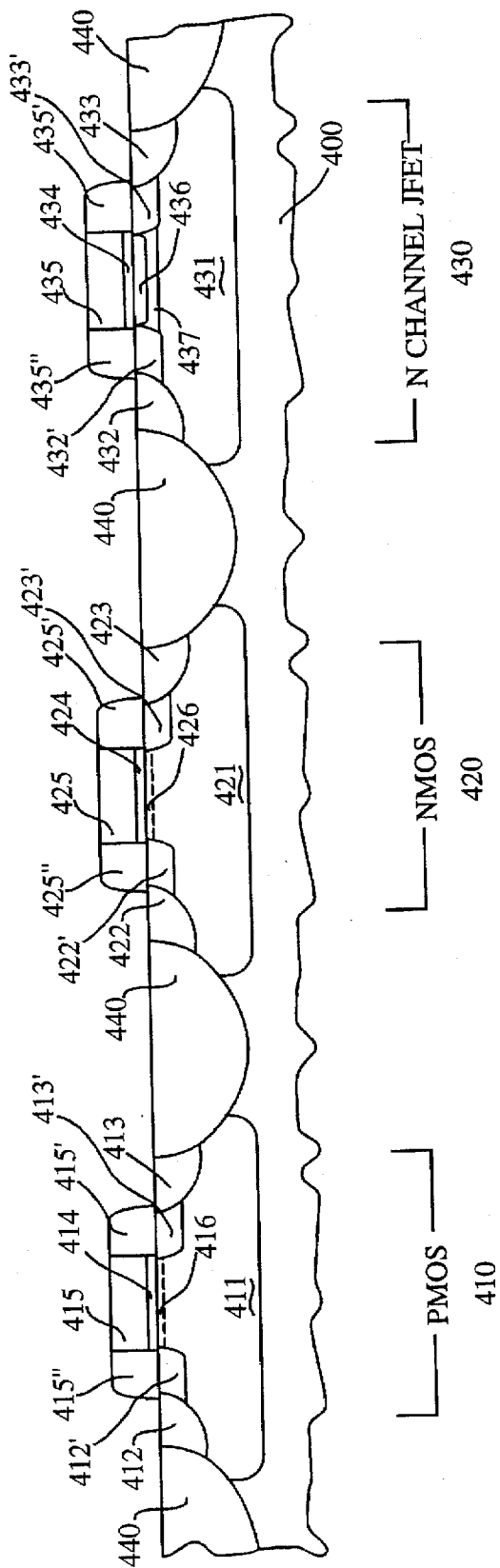
FIG. 4 is an illustration of a cross section of NMOS, PMOS and JFET devices in accordance with the present invention.

FIG. 4 shows a cross-sectional view of semiconductor devices fabricated in accordance with the present invention, including PMOS transistor 410 fabricated adjacent to NMOS transistor 420 which in turn is fabricated adjacent to JFET transistor 430. In particular, transistors 410, 420, and 430 are fabricated adjacently to each other on common substrate 400 of semiconductor crystal material such as silicon in accordance with an embodiment of the present invention.

More particularly according to an embodiment of the present invention, PMOS transistor 410 includes an n-well 411, a p-type source region 412, a p-type drain regions 413, and first and second lightly-doped-drain (LDD) regions 412' and 413'. PMOS transistor 410 further includes a gate oxide region 414 fabricated on the surface of substrate 400 as will be discussed below. Gate oxide region 414 is laterally removed from p-type source and drain regions 412 and 413. PMOS transistor 410 further includes a gate electrode 415, insulation layer regions 415' and 415", and a channel 416 connects p-type source and drain regions 412 and 413. LDD regions 412' and 413' are substantially under corresponding insulation regions 415' and 415", and serve to separate respective source and drain regions 412 and 413 from gate oxide region 414.

According to one embodiment of the present invention, PMOS transistor 410 additionally includes a n-type diffusion or inversion region formed by implanting charged material through gate oxide region 414. According to another embodiment of the present invention, N-well 411 is an adequate diffusion region of semiconductor material that is doped with "donor" or n-type impurities to form a semiconductor region with excess electron carriers. P-type source and drain regions 412, 413 are regions of semiconductor material that are doped with "acceptor" or p-type impurities. Gate oxide region 414 is a layer of insulating oxide, for example silicon dioxide ($SiO_2$). Gate electrode 415 is formed of a conductive material such as polycrystalline silicon (polysilicon). Channel 416 is a charged layer of conducting material formed contiguous to gate oxide region 414 such that the source and drain regions respectively 412, 413 are electrically connected when a gate voltage induces a sufficient electric field at n-well 411.

As further shown in FIG. 4, NMOS transistor 420 comprises a p-well 421; n-type source and drain regions respectively 422, 423; lightly doped drain (LLD) regions 422' and 423'; gate oxide region 424; a gate electrode 425; insulating layer regions 425' and 425"; and a channel 426 of "n-" material which connects n-type source and drain regions 422 and 423 when a suitable voltage is applied to gate electrode 425. According to one embodiment of the present invention, NMOS transistor 420 includes a p-type diffusion or inversion region between LLD regions 422' and 423' which includes charged ion material that is implanted through gate oxide region 424 in conventional manner. According to another embodiment of the present invention, the charged material is provided by the earlier doping of p-well 421. LDD regions 422' and 423' are substantially under corresponding insulation regions 425' and 425", and serve to separate respective source and drain regions 422 and 423 from gate oxide region 424.

P-well 421 of NMOS transistor 420, which is shown in FIG. 4, is a region of semiconductor material that is doped with "acceptor" or p-type impurities. Respective n-type source and drain regions 422, 423 of NMOS transistor 420 are regions of semiconductor material that are doped with "donor" or n-type impurities. Gate oxide region 424 is a layer of insulating oxide, for example silicon dioxide ($SiO_2$). Gate electrode 425 is formed of a conductive material such as polycrystalline silicon (polysilicon). Channel 426 is a layer of charged conducting material that forms contiguous to the gate oxide region 424, with source and drain regions 422, 423 being electrically connected when a voltage at the gate induces an electric field across the p-well 421.

JFET transistor 430 in FIG. 4 is an n-channel JFET comprising a p-well 431; respective n-type source and drain electrodes 432, 433; gate oxide region 434; a gate electrode 435; a channel region 437 connecting the n+ source and drain regions; and a p-type diffusion region 436 formed by implanting charged material through gate oxide region 434.

P-well 431 is a region of semiconductor material that is doped with p-type impurities. Respective n-type source and drain regions 432, 433 are regions of semiconductor material that are doped with donor or n-type impurities to form a semiconductor region with excess electron carriers. Gate oxide region 434 is a layer of insulating oxide, for example silicon dioxide ($SiO_2$) which is grown on the semiconductor surface. Gate electrode 435 is formed of a conductive material such as polycrystalline silicon (polysilicon or poly). According to one embodiment of the present invention, implantation includes providing a layer of gate oxide which is approximately 0.007 microns thick and then providing a layer of polysilicon to approximately 0.3 microns over the gate oxide. Then the selected gate region is masked and boron is implanted in the polysilicon to a concentration of on the order $1\times10^{14}/cm^2$–$1\times10^{15}/cm^2$ and at a sufficient energy level so that the boron goes through the polysilicon and comes out the other side to form p-type diffusion region 436 once subject to heat treatment. Implanted region 436, according to one embodiment of the present invention, is on the order of 0.01–0.1 micron thick.

Channel region 437 is a region of n-type material connecting the source and drain regions. Channel region 437 has a lesser n-type impurity concentration than the impurity concentration of the source and drain regions 432, 433. P-type diffusion region 436 is a semiconductor region with p-type impurities. Accordingly, p-type diffusion region 436 forms a PN junction having a bias controlled by the voltage at the gate electrode region 435. The PN junction bias determines the extent of the depletion region in the JFET channel. Thus, this gate PN junction is used to control the channel current by either narrowing or widening the channel by varying the extent of the depletion region. Although FIG. 4 illustrates an n-channel JFET formed on a common substrate with MOS transistors, the present invention may also be practiced as a p-channel JFET formed on a common substrate with MOS transistors or as both a p-channel JFET and an n-channel JFET formed on a common substrate with MOS transistors.

Figure 5:
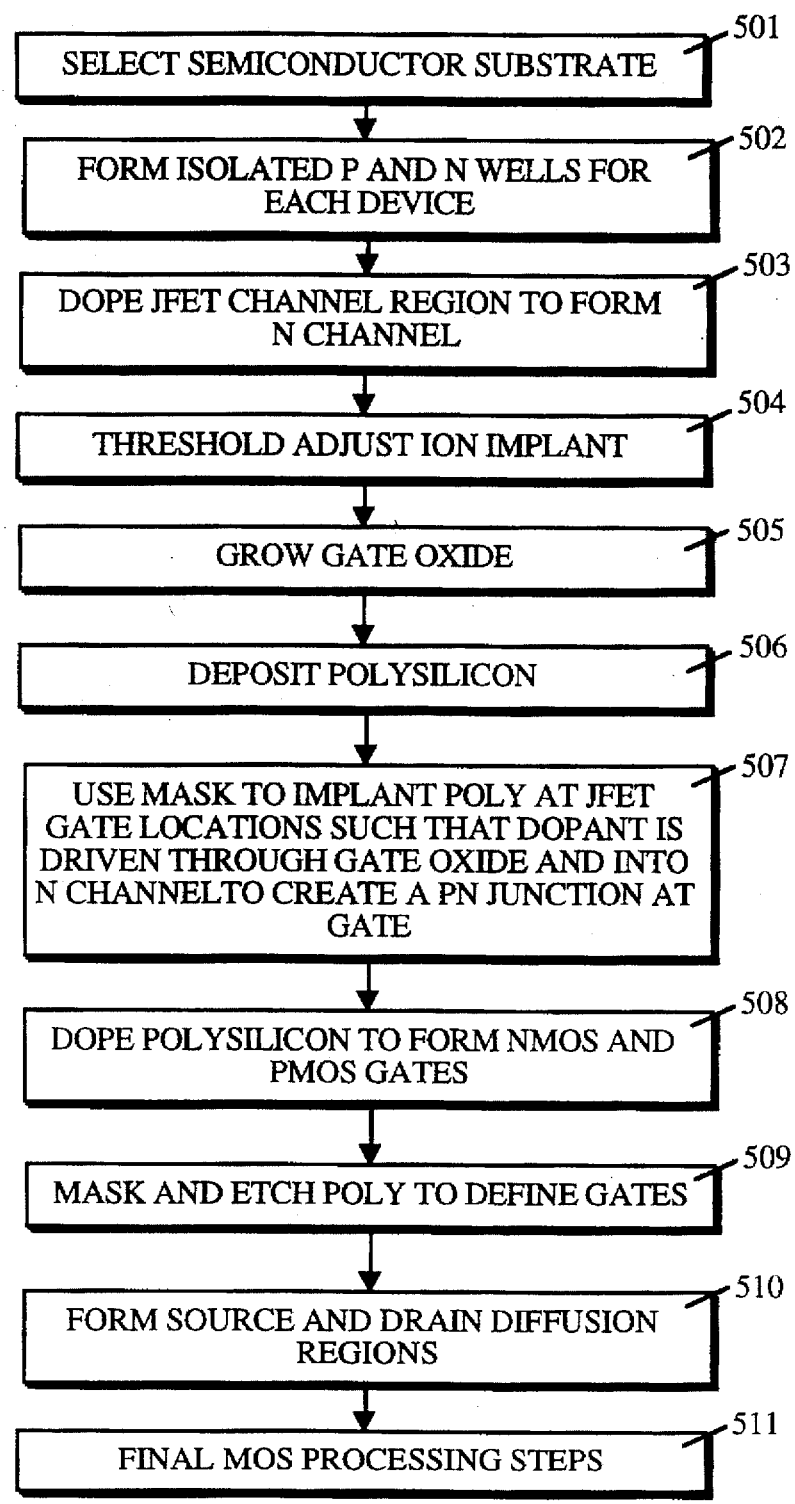
FIG. 5 shows the fabrication steps of a JFET device in accordance with the present invention.

Although the present invention is suited for p-well and n-well processes, according to one embodiment of the present invention, a twin-well process is used to fully optimize both NMOS and PMOS transistor types. FIG. 5 is a flow diagram of a twin-well process for producing MOS and JFET devices on a common substrate in accordance with the present invention.

According to an embodiment of the present invention shown in the flow chart of FIG. 5, a suitable semiconductor substrate 400 is selected 501 for fabrication. Typically, semiconductor substrate 400 will be a silicon wafer cut from a single silicon crystal.

As a next step of the method of the present invention shown in the flow chart of FIG. 5, p- and n- wells are fabricated in substrate 400. In particular, p- well 411 and first and second n-wells 421 and 431 are formed 502 in semiconductor substrate 400 respectively to define transistor locations for p-channel PMOS transistor 410, n-channel NMOS transistor 420, and n-channel JFET 430. The respective n- and p- wells are fabricated according to conventional photolithographic processing techniques.

In particular, the fabrication of a well region includes growing a layer of silicon dioxide ($SiO_2$) over the surface of substrate 400 and using suitable photoresist materials, photomasks and etching compounds to remove selected regions of the silicon dioxide according to a predetermined pattern. P-wells are formed by selectively removing the oxide layer grown on substrate 400 from only p-well locations, and then implanting p-type impurity dopants such as boron. After dopant implantation, substrate 400 is heated to enable dopant diffusion into the silicon crystalline structure.

Similarly, n-wells are formed using an analogous process by implanting a selected n-type dopant such as phosphorous in regions where the oxide layer has been removed to permit implantation. Similar mask and photolithographic techniques are employed in fabrication of JFET channels. According to one embodiment of the present invention, an n-channel JFET device is formed, and the channel regions of the JFET are fabricated by a process including doping with an n-type impurity material such as phosphorous. The channel region is lightly doped 503 "n-" to an impurity concentration less than n-type doping.

Next, a threshold-adjusting ion implant is made 504 in conventional manner to control the threshold voltages in n-well 411 of PMOS transistor 410 and the p-well of NMOS transistor 420.

According to a next step of fabrication in accordance with the present invention as shown in the flow chart of FIG. 5, a layer of insulating gate oxide ($SiO_2$) is grown 505 on substrate 400 to a thickness, for example, of 80 angstroms or less for 0.5 micron technologies and smaller. After growing 505 a layer of insulating gate oxide, polysilicon is deposited 506 on substrate 400 and over the insulating gate oxide.

Next, the gate PN junction for n-channel JFET transistor 430 is formed by using a mask to isolate the n-channel JFET locations and then implanting 507 the polysilicon with p-type material such as boron fluoride ($BF_2$) for example. The polysilicon is implanted with p-type dopant impurities driven through the insulating layer of gate oxide and into the n-channel of JFET transistor 430. The p-type impurities which are driven through the insulating layer of gate oxide form a p-type diffusion region in a lightly doped n-channel which creates a PN junction at the JFET gate.

Further according to the method of the present invention, selected areas of the deposited polysilicon are masked, doped, and etched 509 to establish respective NMOS and PMOS gates 415 and 425. Additionally, source and drain regions are formed 510, and final device fabrication is completed 511 according to well-known conventional processing steps.

The above mentioned process of FIG. 5 describes the fabrication of an n-channel JFET using an MOS process in accordance with an embodiment of the present invention. In another embodiment of the present invention a p-channel JFET is formed using an MOS process.

I claim:

1. A method of fabricating a JFET device on a substrate using metal oxide semiconductor processing steps, the method comprising the steps of:

doping a portion of the substrate with an impurity material of a first conductivity type to form a channel region on the substrate;

forming a layer of oxide on the substrate;

depositing a conductive material on the layer of oxide to form a gate electrode;

implanting the gate electrode with charged material of a second conductivity type such that the charged material is driven through the layer of oxide to form a semiconductor junction in the channel region and wherein the semiconductor junction has a diffusion region of the second conductivity type immediately contiguous with the layer of oxide; and forming a source diffusion region of the first conductivity type and a drain diffusion region of the first conductivity type on the substrate with the source and drain diffusion regions being laterally separated and connected by the channel region.

2. The method of claim 1 wherein the source and drain diffusion regions are n-type material and the charged material implanted through the gate electrode is phosphorous.

3. The method of claim 1 wherein the source and drain diffusion regions are p-type material and the charged material implanted through the gate electrode is boron.

* * * * *